(12) United States Patent
Gumann et al.

(10) Patent No.: US 11,108,120 B2
(45) Date of Patent: Aug. 31, 2021

(54) DC-CAPABLE CRYOGENIC MICROWAVE FILTER WITH REDUCED KAPITZA RESISTANCE

(71) Applicant: International Business Machines Corporation, Armonk, NY (US)

(72) Inventors: Patryk Gumann, Tarrytown, NY (US); Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/037,867

(22) Filed: Sep. 30, 2020

(65) Prior Publication Data

US 2021/0013570 A1    Jan. 14, 2021

Related U.S. Application Data

(62) Division of application No. 16/136,956, filed on Sep. 20, 2018, now Pat. No. 10,886,585.

(51) Int. Cl.
*H01P 1/203* (2006.01)
*H01P 1/205* (2006.01)
(Continued)

(52) U.S. Cl.
CPC .............. *H01P 1/203* (2013.01); *H01B 12/02* (2013.01); *H01P 1/205* (2013.01); *H01P 1/30* (2013.01);
(Continued)

(58) Field of Classification Search
CPC . H01B 12/02; H01P 1/20; H01P 1/203; H01P 1/30; H01P 11/003; H01P 11/007; H05K 7/20372
(Continued)

(56) References Cited

U.S. PATENT DOCUMENTS 6,571,110 B1    5/2003  Patton et al.
6,711,912 B2    3/2004  Laubacher et al.
(Continued)

FOREIGN PATENT DOCUMENTS

CN    108232398 A    6/2018
JP    2006-262396 A    9/2006
WO    2017/007446 A1    1/2017

OTHER PUBLICATIONS

International Search Report and Written Opinion received for PCT Application Serial No. PCT/EP2019/073842 dated Dec. 6, 2019, 37 pages.

(Continued)

*Primary Examiner* — Rakesh B Patel

(74) *Attorney, Agent, or Firm* — Amin, Turocy & Watson, LLP

(57) ABSTRACT

An architecture for, and techniques for fabricating, a cryogenic microwave filter having reduced Kapitza resistance are provided. In some embodiments, the cryogenic microwave filter can comprise a substrate and a conductive line. The substrate can be formed of a material having a thermal conductivity property that sufficiently reduces Kapitza resistance in the cryogenic environment. The conductive line can be formed in a recess of the substrate and facilitate a filter operation on a microwave signal propagated in a cryogenic environment. In some embodiments, the conductive line can be formed according to a sintering technique that can reduce Kapitza resistance.

12 Claims, 12 Drawing Sheets

(51) Int. Cl.
    *H01P 1/30*    (2006.01)
    *H01P 11/00*   (2006.01)
    *H05K 7/20*    (2006.01)
    *H01B 12/02*   (2006.01)
(52) U.S. Cl.
    CPC .......... *H01P 11/003* (2013.01); *H01P 11/007* (2013.01); *H05K 7/20372* (2013.01)
(58) Field of Classification Search
    USPC .................................................. 333/204, 205
    See application file for complete search history.

(56)            References Cited

U.S. PATENT DOCUMENTS

| 7,565,188 B2 | 7/2009 | Akasegawa et al. |
| 9,716,299 B2 | 7/2017 | Balandin |
| 2002/0038720 A1* | 4/2002 | Kai ........................... H01P 7/04 174/125.1 |
| 2009/0181226 A1* | 7/2009 | Ning .................... H05K 3/1258 428/209 |
| 2013/0258595 A1 | 10/2013 | Tuckerman |
| 2017/0148972 A1 | 5/2017 | Thompson et al. |
| 2020/0035901 A1 | 1/2020 | Olivadese et al. |

OTHER PUBLICATIONS

Non-Final Office Action received for U.S. Appl. No. 16/136,956 dated May 15, 2020, 23 pages.

\* cited by examiner

DC-CAPABLE CRYOGENIC MICROWAVE FILTER WITH REDUCED KAPITZA RESISTANCE

BACKGROUND

The subject disclosure generally relates to microwave filter devices that exhibit reduced Kapitza resistance in a cryogenic environment where temperatures are very low, and more specifically to filter devices that are capable of direct current (DC) measurements.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Hence, a fundamental element of quantum computing is the quantum bit (qubit). A qubit represents a quantum mechanical system where information can be encoded and manipulated. A significant aspect of a qubit is coherence time, which represents how long a quantum state of the qubit can be maintained.

A successful implementation of quantum computing will likely exponentially extend the computing power of current computational systems, having the potential to revolutionize numerous technological fields. Today, there are many suggested approaches to implementing a quantum computing device. One of the most feasible approaches to implementation of a quantum computing architecture is based on superconducting devices, which are typically implemented in a cryogenic environment. A cryogenic environment can be one with very low pressure (e.g., a vacuum or near-vacuum) and very low temperature. For example, a cryogenic environment may exhibit temperatures below about 100 degrees Kelvin (K) and can be as low as about 10 millikelvin (mK) or less, such as in a superconducting based quantum computing environment.

The performance of any superconducting based quantum computing architecture is heavily depended on the quality of the superconducting quantum bits (e.g., qubits), which can be directly characterized by the measuring coherence times and qubit errors. These coherence times and qubit errors strongly depend on the performance of microwave hardware (e.g., filter devices) at low temperatures.

While microwave filters do exist, even some that are commercially advertised to be suitable for cryogenic environments, existing microwave filters do not appear to be designed or tested to operate at temperatures lower than 77 K, not to mention the temperatures (e.g., near or below 10 mK) that might accompany a superconducting based quantum computing implementation.

Hence, a technical problem arises in the field of quantum computing in that, at certain cryogenic temperatures (e.g., below about 77 K), existing microwave frequency filters or attenuators can behave in unexpected ways. For example, elements of a microwave filter or attenuator, in a cryogenic environment, may become superconductive, and no longer function to pass, filter, or attenuate the signal based on frequency. The inventors have identified that this technical problem arises due at least in part to various materials used to implement the filter device exhibiting insufficient thermal conductivity. Traditionally, dielectric materials and conductive materials are selected based on electrical properties and cost, with little or no consideration for thermal properties.

A related technical problem arises due to a phenomenon known as Kapitza resistance, which tends to be negligible at room temperature or above cryogenic temperatures but can become very significant at cryogenic temperatures. Kapitza resistance refers to a thermal resistance effect at a boundary between different materials in the presence of a heat flux. In other words, Kapitza resistance can prevent various materials within a low temperature environment from settling at a uniform temperature.

For example, suppose an ambient temperature and/or the temperature flux across the interface between the two materials in a cryogenic refrigerator is 10 mK. Microwave hardware within that environment can comprise a conductive line formed in a dielectric, where the electrically conductive line can provide filtering, for instance by passing or attenuating the microwave signal based on frequency. The dielectric might be cooled to 10 mK. However, the conductive line, which in operation may represent a source of heat, may not effectively transfer heat from the conductive line to the dielectric due in part to the Kapitza resistance phenomenon. Thus, the conductive line might remain at a temperature significantly higher than the ambient environment and/or the dielectric in which the conductive line is situated. The inventors have identified that a temperature difference between the dielectric and the conductive line can cause various problems such as low frequency noise, unexpected behavior, and others, any one of which can negatively impact the quality of qubits (e.g., coherence times and qubit errors) of a quantum computing device that relies on the microwave hardware.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, methods, apparatus and/or products that facilitate reduced Kapitza resistance at low temperatures are described.

According to an embodiment of the present invention, a cryogenic microwave filter can be provided. The cryogenic microwave filter can comprise a substrate formed of a material determined to have a thermal conductivity that is above 200 watts per meter-Kelvin (W/m-K) at a temperature of 77 degrees Kelvin (K). The cryogenic microwave filter can further comprise a conductive line formed in a recess of the substrate, wherein the conductive line facilitates a filter operation on a microwave signal propagated in a cryogenic environment having a temperature below about 77 K. An advantage provided by this cryogenic microwave filter can be improved performance at very low temperatures such as temperatures associated with a cryogenic environment in which a quantum computing architecture can be implemented. In some embodiments, the material of the substrate can be sapphire. In some embodiments, the material can be diamond. While more traditional substrate materials exhibit thermal conductivity that is below 200 W/m-K at 77 K, both sapphire and diamond exhibit thermal conductivity well above 200 W/m-K at 77 K. An advantage provided by employing sapphire or diamond in the substrate is that Kapitza resistance at boundary interfaces for the substrate can be reduced. Such can result in improved heat exchange between the substrate and other materials in contact with the substrate.

According to an embodiment of the present invention, method can be provided. The method can comprise forming, by a fabrication device, a recess in a substrate. The recess can have a geometry determined as a function of a filter operation for electromagnetic radiation having frequencies within a microwave spectrum between 300 megahertz (MHz) and 300 GHz. The method can further comprise, sintering, by the fabrication device, a conductive material in the recess, resulting in a conductive line situated in the recess of the substrate. An advantage provided by this method can be improved performance at very low temperatures such as temperatures associated with a cryogenic environment in which a quantum computing architecture can be implemented. For example, by sintering the conductive line, Kapitza resistance between the conductive line and the substrate can be reduced due to increased surface contact area between the conductive line and the substrate. In some embodiments, the substrate can be formed of a dielectric material that acts as an electrical insulator while maintaining a thermal conductivity that is above 200 W/m-K at 77 K. In some embodiments, the thermal conductivity of the material is above 1000 W/m-K at 20 K. An advantage provided by these successively higher thermal conductivity thresholds is that Kapitza resistance at boundary interfaces for the substrate can be reduced to varying degrees, resulting in varying increases in heat exchange between the substrate and other materials in contact with the substrate, which can be application-specific.

According to an embodiment of the present invention, method for fabricating a cryogenic microwave filter can be provided. The method can comprise forming, by a fabrication device, a dielectric that operates as an electrical insulator and a thermal conductor at cryogenic temperatures below about 4 K. The dielectric can comprise a material having a thermal conductivity that is above about 50 W/m-K at 4 K. The method can further comprise forming, by the fabrication device, a recess pattern in the dielectric. The recess pattern can be determined as a function of a filter operation for electromagnetic radiation having frequencies within a microwave spectrum between 300 MHz and 300 GHz. Further still, the method can comprise, sintering, by the fabrication device, a conductive material in a recess of the recess pattern, resulting in a conductive line having the recess pattern formed in the recess of the dielectric. An advantage provided by this method can be improved performance at very low temperatures such as temperatures associated with a cryogenic environment in which a quantum computing architecture can be implemented. For example, Kapitza resistance can be reduced in multiple ways. For instance, Kapitza resistance can be reduced by selecting the dielectric material to have very high thermal conductivity and also by sintering the conductive line which can result in increased surface contact area between the conductive line and the substrate.

According to an embodiment of the present invention, a filter device can be provided. The filter device can comprise a dielectric formed of a dielectric material determined to have a thermal conductivity that is above 200 watts per meter-Kelvin (W/m-K) at a temperature of 77 degrees Kelvin (K). The dielectric can comprise a recess in a pattern determined to provide DC-capable filtering operations in connection with microwave signals having frequencies in a range of between about 300 MHz and about 300 GHz. The filter device can further comprise a conductive line formed in the recess of the substrate. The conductive line can facilitate the filtering operations and can comprise a conductive material that has been sintered. An advantage provided by this cryogenic microwave filter can be improved performance at very low temperatures such as temperatures associated with a cryogenic environment in which a quantum computing architecture can be implemented. For example, Kapitza resistance can be reduced in multiple ways. For instance, Kapitza resistance can be reduced by selecting the dielectric material to have very high thermal conductivity and also by sintering the conductive line which can result in increased surface contact area between the conductive line and the substrate. In some embodiments, the material of the dielectric can be sapphire. In some embodiments, the material can be diamond. While more traditional dielectric materials exhibit thermal conductivity that is below 200 W/m-K at 77 K, both sapphire and diamond exhibit thermal conductivity well above 200 W/m-K at 77 K. An advantage provided by employing sapphire or diamond in the substrate is that Kapitza resistance at boundary interfaces for the substrate can be significantly reduced, resulting in significantly improved heat exchange between the substrate and other materials in contact with the substrate.

According to an embodiment of the present invention, a cryogenic microwave filter product formed by a process can be provided. The process can comprise forming, by a fabrication device, a dielectric that operates as an electrical insulator and a thermal conductor at cryogenic temperatures below about 77 K. The dielectric can comprise a material having a thermal conductivity that is above about 200 W/m-K at 77 K. The process can further comprise forming, by the fabrication device, a recess pattern in the dielectric. The recess pattern can be configured as a function of a filter operation for electromagnetic radiation having frequencies within a microwave spectrum between 300 MHz and 300 GHz. Further still, the process can comprise, sintering, by the fabrication device, a conductive material in the recess, resulting in a sintered conductive line situated in the dielectric according to the recess pattern. An advantage provided by this method can be improved performance at very low temperatures such as temperatures associated with a cryogenic environment in which a quantum computing architecture can be implemented. For example, Kapitza resistance can be reduced in multiple ways. For instance, Kapitza resistance can be reduced by selecting the dielectric material to have very high thermal conductivity and also by sintering the conductive line which can result in increased surface contact area between the conductive line and the substrate.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Figure 1:
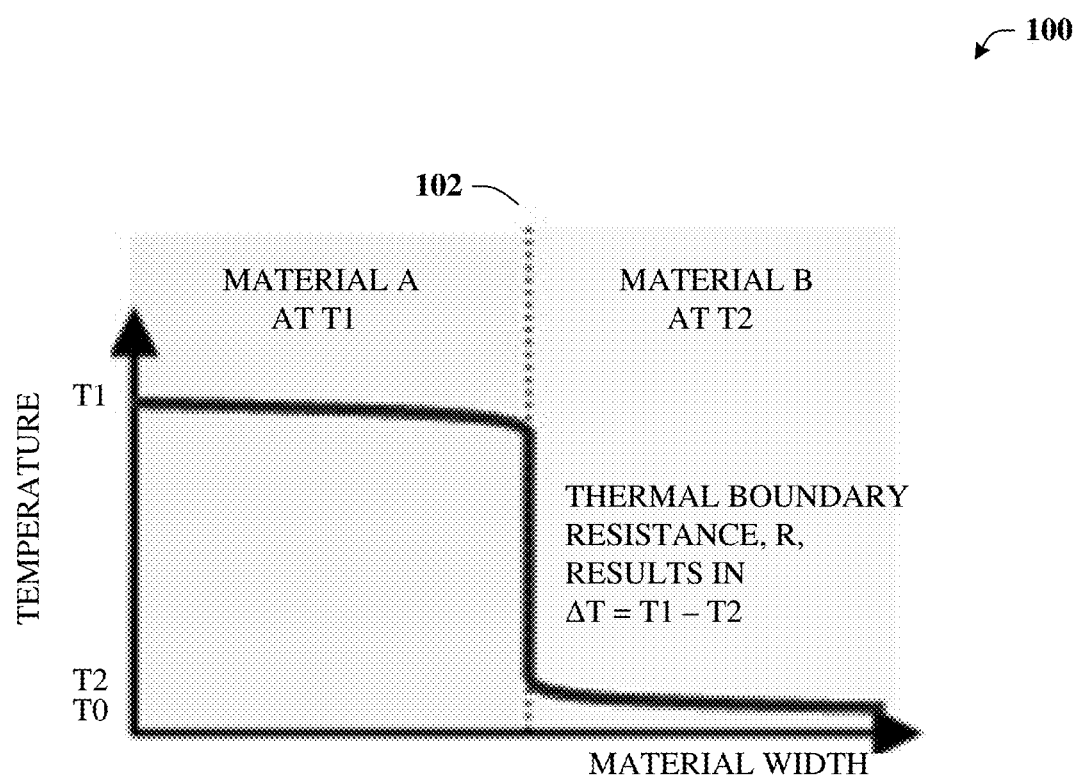
FIG. 1 illustrates a block diagram of system and an overlaid temperature graph illustrating effects of Kapitza resistance in accordance with one or more embodiments.

Turning now to the drawings, with initial reference to FIG. 1, a block diagram of system 100 and an overlaid temperature graph illustrating effects of Kapitza resistance in accordance with one or more embodiments. System 100 can comprise two different materials that share a boundary interface 102, where one material has contact with the other material. Hence, in this example, material A contacts material B at boundary interface 102. It is assumed in this example that both materials or the interface between the two materials is subject to a common temperature flux and/or the ambient temperature is the same for both, call it T0. It is further assumed that material A has an initial temperature, T1, and material B has an initial temperature T2 that is lower than T1.

At room temperature, where the effects of Kapitza resistance tend to be negligible, material A and material B will likely settle to a common temperature, as heat flows through boundary interface 102 from material A to material B. However, at cryogenic temperatures, where the effects of Kapitza resistance can be much more significant, thermal boundary resistance, R, creates a temperature drop, ΔT, across boundary interface 102. In other words, the thermal boundary resistance prevents some heat exchange between material A and material B such that material A and material B do not settle to a common temperature.

It is believed this temperature mismatch results due to scattering of energy carriers such as phonons or electrons at boundary interface 102. The probability that an energy carrier scatters at boundary interface 102 instead of transferring heat through the boundary is a function of the energy states of the materials on both sides of boundary interface 102. At cryogenic temperatures, these energy states are lower, yielding a much higher probability of scattering. It has been observed that at low temperatures, such as cryogenic temperatures, the phenomenon of Kapitza resistance, AKA thermal boundary resistance, results in a significant temperature drop, ΔT at boundary interface 102 that serves as a boundary between two different materials. It is further observed that this temperature drop, ΔT, can lead to technical problems that are further detailed in connection with FIG. 2.

Figure 2:
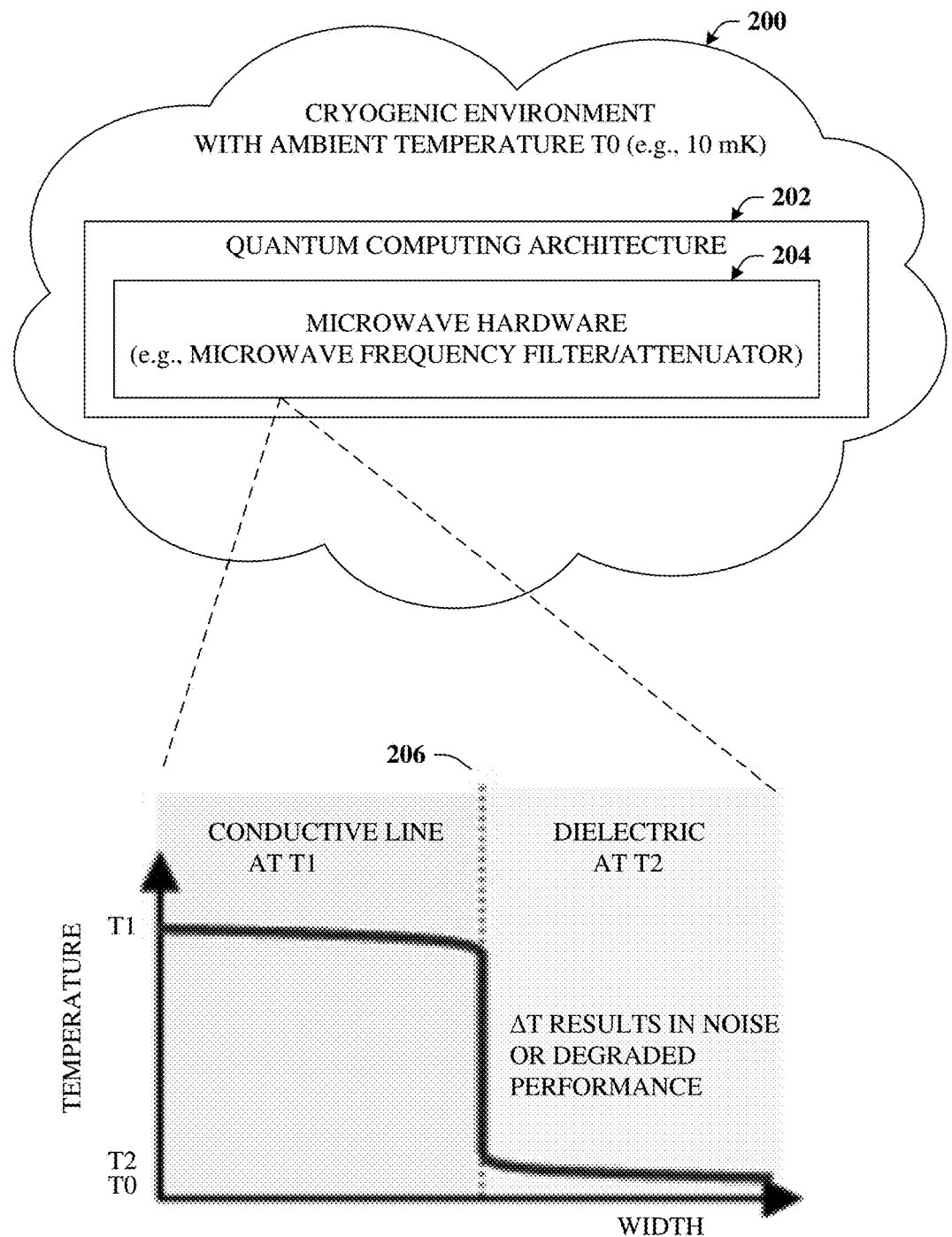
FIG. 2 illustrates a block diagram of cryogenic environment demonstrating problematic results of Kapitza resistance in accordance with one or more embodiments.

With reference now to FIG. 2, a block diagram of cryogenic environment 200 demonstrating problematic results of Kapitza resistance in accordance with one or more embodiments. Repetitive description of like elements employed in other embodiments described herein is omitted for sake of brevity. Cryogenic environment 200 may exhibit a very low pressure or be a vacuum. Cryogenic environment 200 may be refrigerated to a very low temperature such as less than about 77 K, and might in fact be below 1 K, and in some cases 10 millikelvin or less. Within cryogenic environment 200 can be some portion of quantum computing architecture 202.

Quantum computing architecture 202 can comprise various microwave hardware 204 such as, for instance, a microwave frequency filter or attenuator. For example, a microwave frequency filter can be employed for controlling a superconducting qubit of quantum computing architectures 202. The internal structure of the microwave frequency filter can comprise a conductive line situated in a dielectric. Hence, the conductive line shares various instances of boundary interface 206 with the dielectric, which can be similar to that described in connection with material A and material B in FIG. 1. Assuming the temperature flux across boundary interface 206 is T0, conductive line is at T1, and dielectric is at T2, then Kapitza resistance can cause a temperature drop, ΔT, across boundary interface 206. Put differently, the conductive line is not thermalized and maintains a temperature that is higher by ΔT than the dielectric. It has been observed that temperature differences between the conductive line and dielectric can cause microwave hardware 204 to behave unexpectedly. For example, this temperature difference can result in low frequency noise or other degraded performance of microwave hardware 204. Such can lead to shorter coherence times, increased qubit errors, or other degraded performance of quantum computing architecture 202. In some instances, elements (e.g., the conductive line) of microwave hardware 204 might become superconductive at very low temperatures, in which case the microwave hardware 204 may not function as intended.

A potential solution to the aforementioned technical problems caused by Kapitza resistance (also referred to as thermal boundary resistance) at boundary interface 206 can be effectuated by various techniques to reduce Kapitza resistance at boundary interface 206. Such a reduction in the thermal boundary resistance can result in a lower value of ΔT, which can avoid the degraded performance of microwave hardware 204 at very low temperatures.

Figure 3:
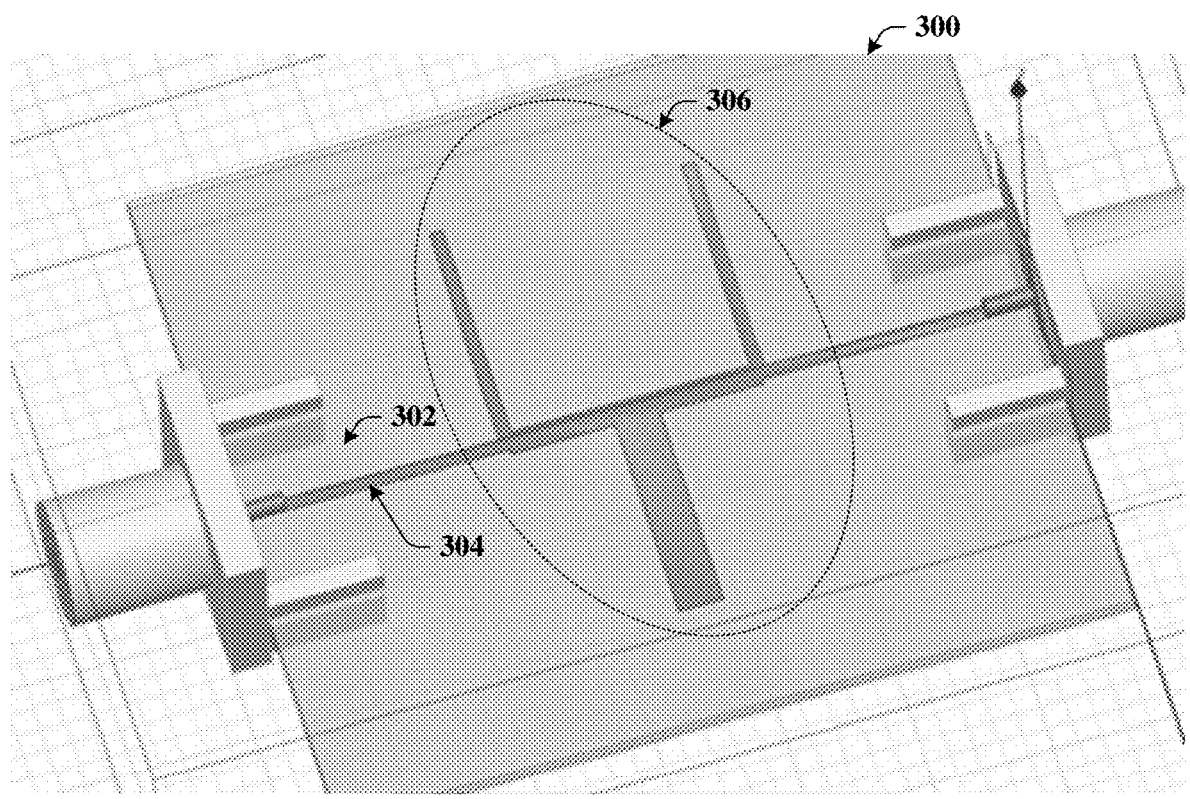
FIG. 3 illustrates a graphical depiction of an example, non-limiting DC-capable cryogenic microwave filter having reduced Kapitza resistance in accordance with one or more embodiments.

FIG. 3 is a graphical depiction of an example, non-limiting cryogenic microwave filter 300 having reduced Kapitza resistance in accordance with one or more embodiments. Repetitive description of like elements employed in other embodiments described herein is omitted for sake of brevity. In some embodiments, cryogenic microwave filter 300 can be utilized to control a qubit of a superconducting quantum computing architecture.

Cryogenic microwave filter 300 can comprise substrate 302. Substrate 302 can be formed of a material determined to have a desirable thermal property. For example, the material can be determined to have a thermal conductivity that is above about 200 watts per meter-Kelvin (W/m-K) at a temperature of 77 degrees Kelvin (K). In some embodiments, the material can be a dielectric material that acts as an electrical insulator. It is appreciated that materials for conventional substrates or dielectrics tend to be selected based on some function of price and desired electrical properties such as being electrically insulating. Without identifying the increased significance of Kapitza resistance at cryogenic temperatures as well as the technical problems said Kapitza resistance can cause, there is no apparent reason for filter designers to consider thermal conductivity properties of a dielectric or substrate, particularly in the event that a given thermal conductivity property might increase the cost of a dielectric or substrate without providing improved electrical properties.

However, by selecting a material determined to have a high thermal conductivity, in this example above 200 W/m-K at 77 K, Kapitza resistance can be reduced and/or $\Delta T$ at boundary interfaces (e.g., exemplified by boundary interface 206 of FIG. 2) can be significantly reduced. Once more, by reducing $\Delta T$, cryogenic microwave filter 300 is less likely to behave unexpectedly and more likely to exhibit improved performance. For example, an associated quantum computing system can realize improved coherence times and fewer qubit errors when relying on cryogenic microwave filter 300 instead of existing microwave filters.

In some embodiments, the material selected for substrate 302 can be sapphire. In some embodiments, the material selected for substrate 302 can be diamond. Other materials are possible, provided such exhibit sufficient thermal conductivity. Both sapphire and diamond have extremely high thermal conductivity, even when compared typical ceramic substrates such as alumina. For example, alumina, which is known to have a high thermal conductivity, but which is one of the most commonly selected materials for a ceramic substrate and/or dielectric due to its low cost and low electrical conductivity has a thermal conductivity of 157 W/m-K at 77 K. By contrast, other materials such as sapphire and diamond have significantly better thermal conductivity at cryogenic temperatures, which is illustrated in Table I.

TABLE I

| Material | Thermal Conductivity (W/m-K) | | | |
| --- | --- | --- | --- | --- |
|  | @ 77K | @ 20K | @ 10K | @ 4K |
| Alumina | 157 | 24 | 5.2 | 0.49 |
| Sapphire | 1100 | 15700 | 29 | 230 |
| Diamond | 3400 | 1500 | 510 | 67 |

Even though Alumina is known to have a high thermal conductivity relative to many other materials, such is typically not high enough, depending on the application. As illustrated in Table I, sapphire and diamond exhibit a thermal conductivity at 77 K that is near to ten (in the case of sapphire) or greater than twenty (in the case of diamond) times higher. At even lower temperatures, e.g., at 4 K, sapphire and diamond can exhibit a thermal conductivity that is more than two orders of magnitude higher than that for alumina. Thus, at cryogenic temperatures, a boundary interface between the substrate and a different material can be expected to have reduced Kapitza resistance and a lower $\Delta T$ when the substrate is composed of, e.g., sapphire or diamond than when composed of more common materials such as alumina.

Cryogenic microwave filter 300 can further comprise conductive line 304. Conductive line 304 can be formed in a recess or multiple recesses of substrate 302. Conductive line 304 can facilitate a filter operation on a microwave signal propagated in a cryogenic environment having a temperature below about 77 K.

In some embodiments, the filter operation facilitated by conductive line 304 can be a function of a geometry of the recesses in substrate 302. For example, since conductive line 304 can be formed in these recesses or conductive line 304 can fill some portion of the recess, a pattern of the recesses can provide or facilitate the desired filtering operation. In this example, recess pattern 306 illustrates one example of a suitable geometry. In some embodiments, the filter operation facilitated by recess pattern 306 can be a bandpass filter operation, where frequencies of the microwave signal that are within a defined range are passed by the bandpass filter operation and other frequencies beyond the defined range can be filtered or attenuated by the bandpass filter operation.

As one example, recess pattern 306 may facilitate passing frequencies between 5.5 gigahertz (GHz) and 6.5 GHz, while filtering or attenuating frequencies beyond the band of allowed frequencies such as those below 5.5 GHz or above 6.5 GHz. It is appreciated that the defined range of frequencies that are passed can have a bandwidth of approximately one GHz or some other value depending on the geometry of recess pattern 306. This band of defined frequencies that are passed, having a width of one GHz or some other width, can be situated substantially anywhere in the microwave spectrum, which is typically between about 300 megahertz (MHz) and 300 GHz. However, for certain applications used in conjunction with quantum computing architectures, filtering or attenuating frequencies within the ranges of between about one GHz and about 10 GHz can be of more significance. For instance, passing frequencies (while attenuating frequencies outside the range) within the defined ranges between about 4.5 GHz to about 5.5 GHz, between about 5.5 GHz to about 6.5 GHz, between about 6.5 GHz to about 7.5 GHz, and so on can be representative of a typical microwave filter.

As has been discussed, cryogenic microwave filter 300 can have significant advantages over other filter devices, particularly with regard to reducing Kapitza resistance at cryogenic temperatures. The inventors have identified that Kapitza resistance can be reduced in a number of different ways. For example, a first technique for reducing Kapitza resistance can be realized by selecting materials for cryogenic microwave filter 300 that have a very high thermal conductivity. As detailed above, such can be in connection with a material selected for substrate 302, in which the selected material has a thermal conductivity that is above about 200 (or some other suitable value) W/m-K, with materials such as sapphire and diamond serving as representative examples. It is further appreciated that materials for conductive line 304 can be selected according to high thermal conductivity properties as well, with some examples given below.

In addition to increasing thermal conductivity of the materials used in cryogenic microwave filter 300, it has been observed that Kapitza resistance can be reduced in other ways as well. For example, consider again boundary interface 206 of FIG. 2, noting that one or more similar boundary interfaces can exist between substrate 302 and conductive line 304. While the interface between two different materials might be represented as a smooth interface, at microscopic scales, the two materials may not be flush across the entire interface, resulting in reduced surface contact area between the two different materials at the boundary interface. This reduced surface contact area represents a technological problem because such results in higher Kapitza resistance or a higher $\Delta T$.

The inventors have observed that both $\Delta T$ and Kapitza resistance can be reduced by increasing the surface contact area between conductive line 304 and substrate 302 and have further determined that such can be accomplished in distinct ways. For example, conductive line 304 can be constructed or formed in such a way that contact at the boundary interface is more flush. As another example, the pressure at the boundary interface can be increased, resulting in more surface contact area.

A technique that can be employed to advantageously leverage both techniques can be to sinter conductive line 304. In other words, conductive line 304 can comprise a conductive material that has been sintered in the recesses of substrate 302. Additional information regarding sintering techniques can be found with reference to FIG. 10. However, it is understood that by sintering conductive line 304, surface contact area at the boundary interface between two materials can be increased, due in part to both creating a better "fit" with the surface of substrate 302 and by exhibiting increased pressure at the interface that tends to smooth out microscopic imperfections where contact might otherwise not exist.

As can be further observed from recess pattern 306 that is representative of a pattern for conductive line 304, various operations of the filter can be performed by measuring one or both direct current (DC) or radio frequency (RF) signals. Thus, cryogenic microwave filter 300 can be DC-enabled or be characterized as a hybrid RF-DC filter.

Figure 4:
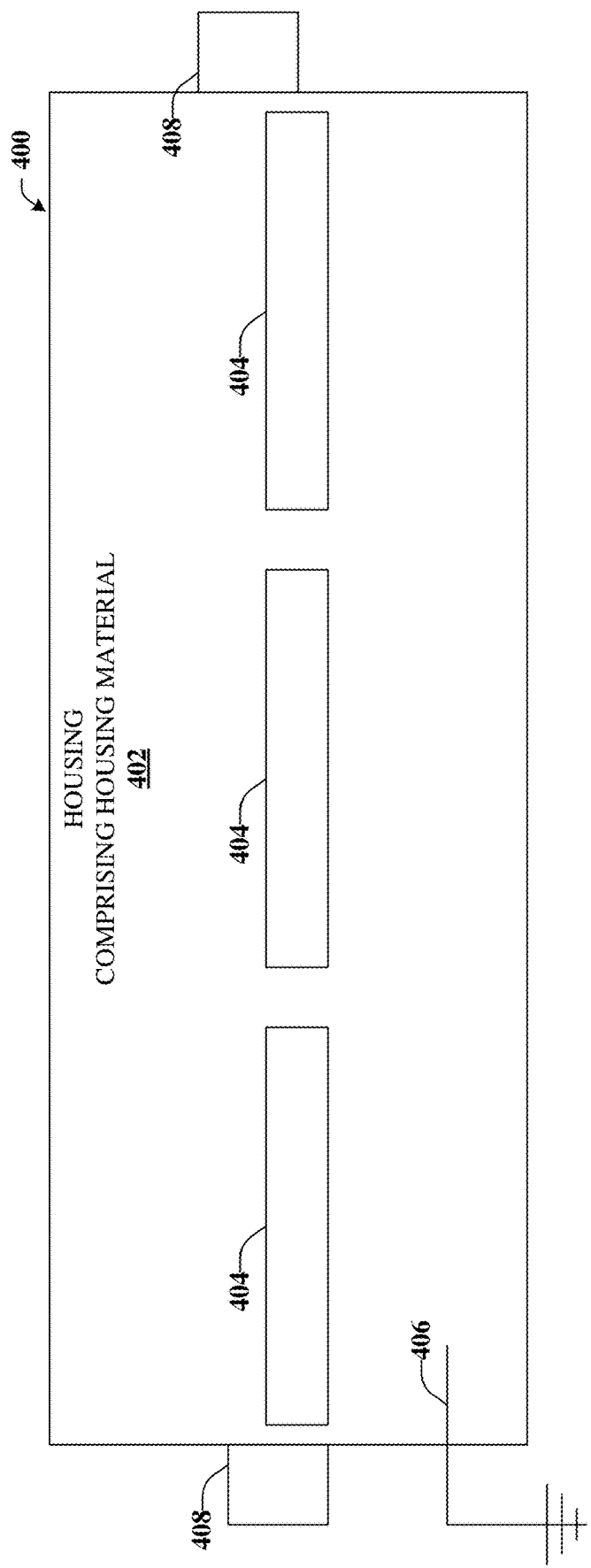
FIG. 4 illustrates a block diagram of an example housing for the cryogenic microwave filter in accordance with one or more embodiments.

Referring now to FIG. 4, an example housing 400 for the cryogenic microwave filter 300 in accordance with one or more embodiments. Repetitive description of like elements employed in other embodiments described herein is omitted for sake of brevity. Housing 400 can encase all or a portion of other components of a cryogenic microwave filter. Housing 400 can comprise housing material 402 that can have various advantageous properties. For example, in some embodiments, housing material 402 can be formed of an oxygen-free material. In some embodiments, housing material 402 can be electrolytic copper or similar. In some embodiments, housing material 402 can shield elements of a cryogenic microwave filter (e.g., cryogenic microwave filter 300) from microwave noise, which can provide further improved performance.

As illustrated by grooves 404, housing 400 can be configured to couple to refrigerator plates or other cryogenic elements that facilitate a transfer of thermal energy away from housing 400 or that operate as a thermal sink. In some embodiments, housing 400 can be coupled to an electrical ground, as illustrated by reference numeral 406. Further still, housing 400 can be integrated into a suitable quantum computing architecture, such as being incorporated into a qubit housing. Connectors 408 can be single pole or high-density microwave connectors such as, e.g., SMP, SMA, Ardent, and so forth. In some embodiments, connectors 408 on both ends of housing 400 or cryogenic microwave filter 300 can have the same gender (e.g., both male or both female). Such a configuration can reduce the number of connections on the qubit control lines, resulting in a reduced number of reflection points and, hence, improved performance.

Figure 5:
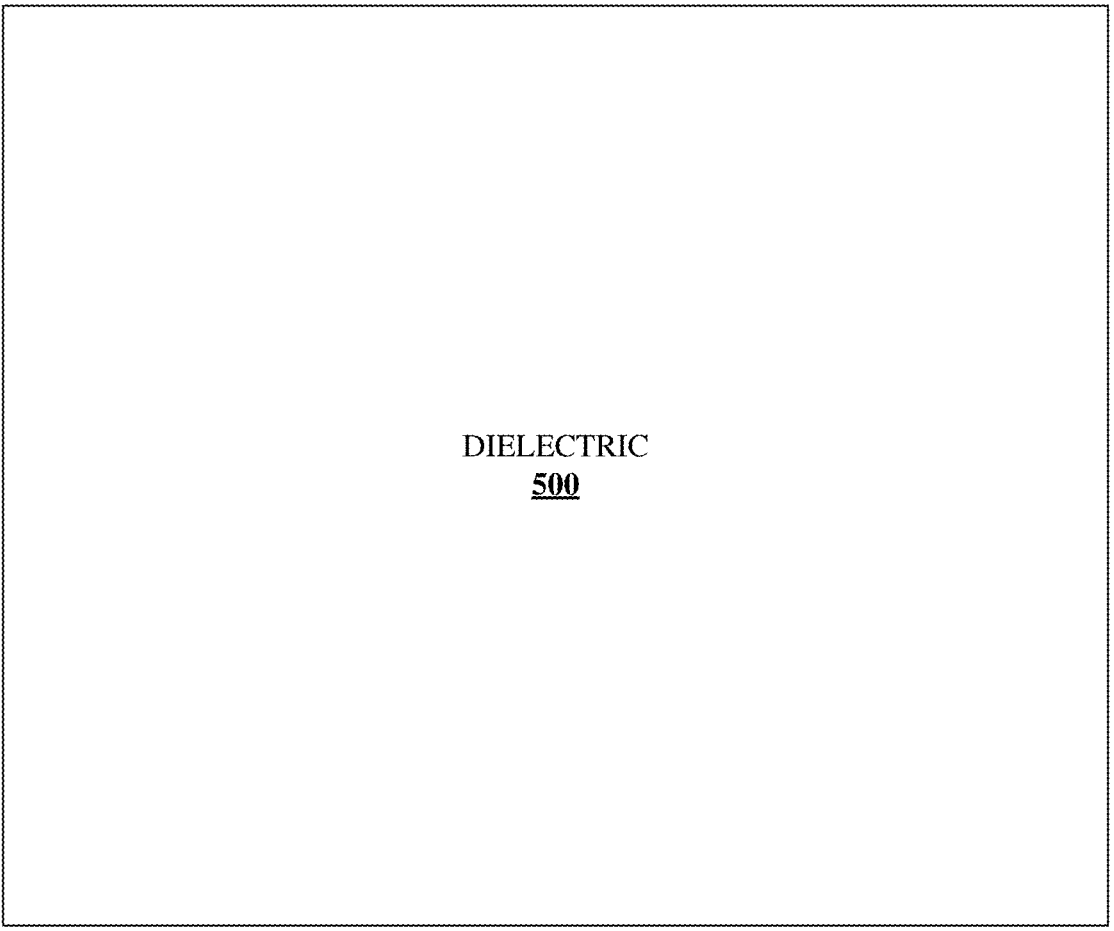
FIGS. 5-7 illustrate a process by which a suitable cryogenic microwave filter product can be produced in accordance with one or more embodiments.
Figure 6:
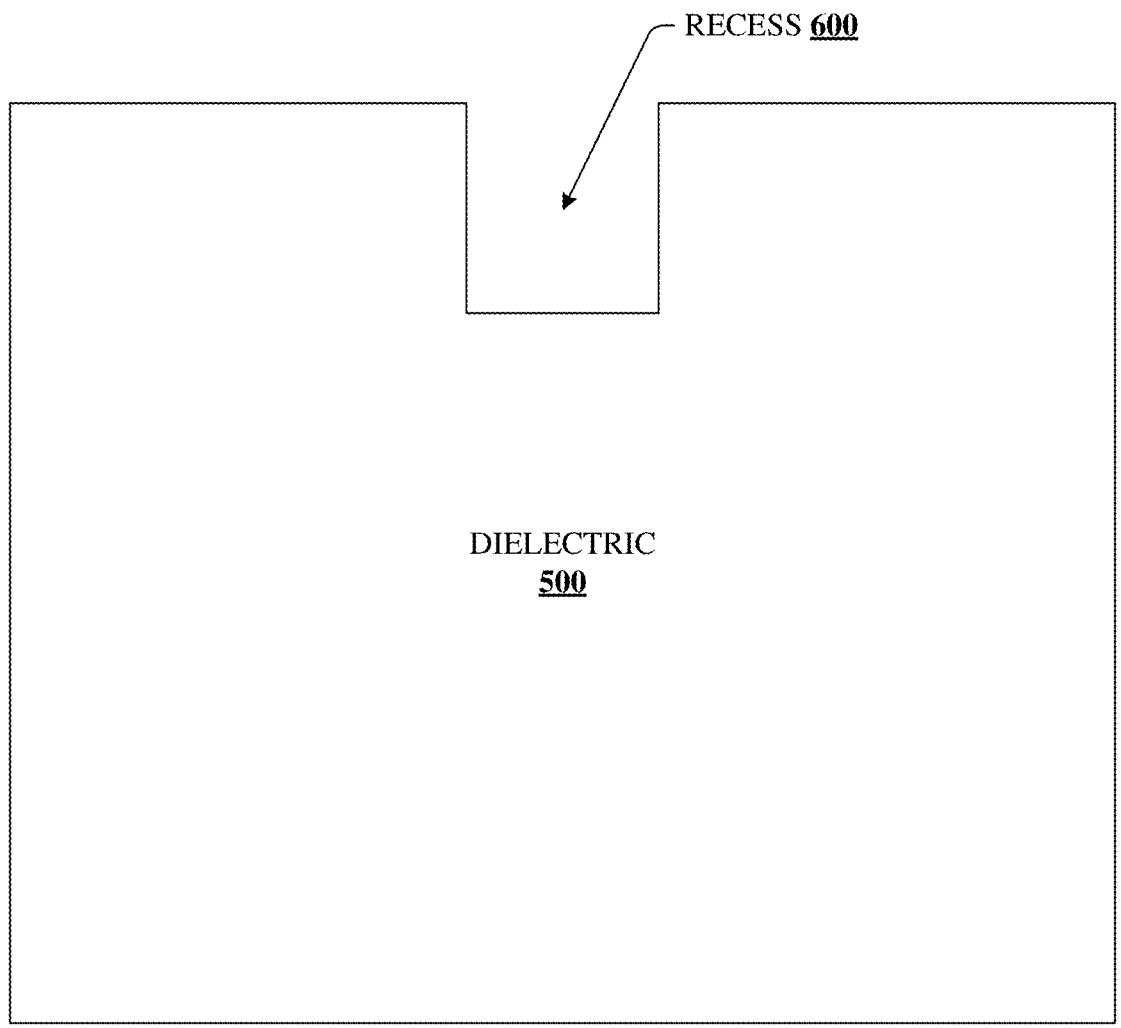
Figure 7:
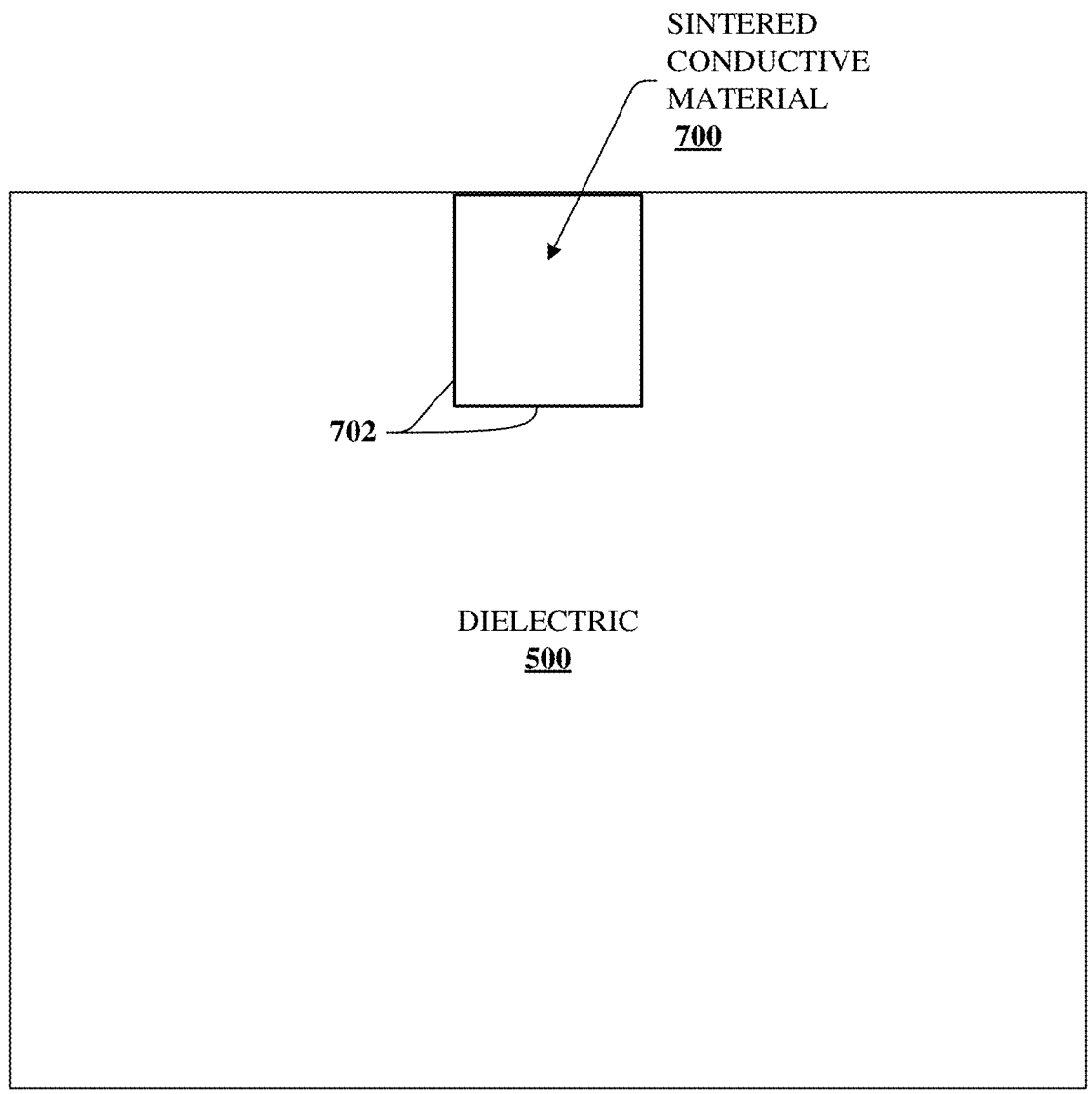

FIGS. 5-7 illustrate a process by which a suitable cryogenic microwave filter product can be produced in accordance with one or more embodiments. Repetitive description of like elements employed in other embodiments described herein is omitted for sake of brevity. In some embodiments, the cryogenic microwave filter product can be representative of the cryogenic microwave filter 300 of FIG. 3, with a cross-section view being depicted at various stages of the process being illustrated.

In that regard, FIG. 5 illustrates forming, e.g., by a fabrication device, dielectric 500. The fabrication device can be controlled by computing elements that comprise a processor and a memory that stores executable instructions that, when executed by the processor, facilitate performance of operations. Examples of said processor and memory, as well as other suitable computer or computing-based elements, can be found with reference to FIG. 12.

In some embodiments, dielectric 500 can be a substrate such as substrate 302. For example, dielectric 500 can operate as an electrical insulator and a thermal conductor at cryogenic temperatures below about 77 K. Dielectric 500 can comprise a material having a thermal conductivity that is above about 200 W/m-K at 77 K. It is understood that the thermal conductivity selected to satisfy a particular application can depend on the application, so other thermal conductivity values can be selected, depending on the application or implementation. For instance, for a different application, the material of dielectric 500 can be selected to have a thermal conductivity that is, e.g., above 1000 W/m-K at a temperature of 77 K, above 1000 W/m-K at a temperature of 20 K, above 20 W/m-K at a temperature of 10 K, and above 10 W/m-K at a temperature of 5 K, or any suitable thermal conductivity value at any cryogenic temperature. Table I above, demonstrates that these example thermal conductivity values at the various temperatures readily distinguish from commonly used dielectrics such as alumina. As discussed, selecting a material with an appropriately high thermal conductivity can significantly reduce Kapitza resistance and significantly reduce the temperature drop, ΔT, at the boundary interface.

FIG. 6 illustrates forming, e.g., by the fabrication device, a recess pattern in dielectric 500 in accordance with one or more embodiments. Repetitive description of like elements employed in other embodiments described herein is omitted for sake of brevity. This recess pattern can be configured as a function of a filter operation for electromagnetic radiation having frequencies within a microwave spectrum, such as between 300 MHz and 300 GHz. A representative example (shown from an overhead view) of the recess pattern that can provide such behavior can be recess pattern 306. FIG. 6 shows recess 600, depicting a cross-section of the recess pattern. Recess 600 can be created by pattern and etching techniques or any other suitable technique.

FIG. 7 illustrates sintered conductive material 700 formed in recess 600 in accordance with one or more embodiments. Repetitive description of like elements employed in other embodiments described herein is omitted for sake of brevity. Sintered conductive material 700 can result from sintering, e.g., by the fabrication device, a conductive material in recess 600. It is understood that various boundary interfaces 702 can exist between sintered conductive material 700 and dielectric 500. As has been described, dielectric 500 can comprise a material be selected to have very high thermal conductivity. Likewise, a conductive material having high thermal conductivity can be selected in connection with sintered conductive material 700, which is further detailed in connection with FIG. 10. Using materials with high thermal conductivity can reduce Kapitza resistance at boundary interfaces 702, thereby improving the performance of the cryogenic microwave filter product in low temperature environments. Furthermore, by sintering the conductive material, surface contact area can be increased at boundary interfaces 702, which can further reduce Kapitza resistance and further improve performance in cryogenic environments.

FIGS. 8-11 illustrate various methodologies in accordance with the disclosed subject matter. While, for purposes of simplicity of explanation, the methodologies are shown and described as a series of acts, it is to be understood and appreciated that the disclosed subject matter is not limited by the order of acts, as some acts can occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts need occur to implement a given methodology in accordance with the disclosed subject matter. Additionally, it should be further appreciated that the methodologies disclosed hereinafter and throughout this specification are capable of being stored on an article of manufacture to facilitate transporting and transferring such methodologies to computers.

Figure 8:
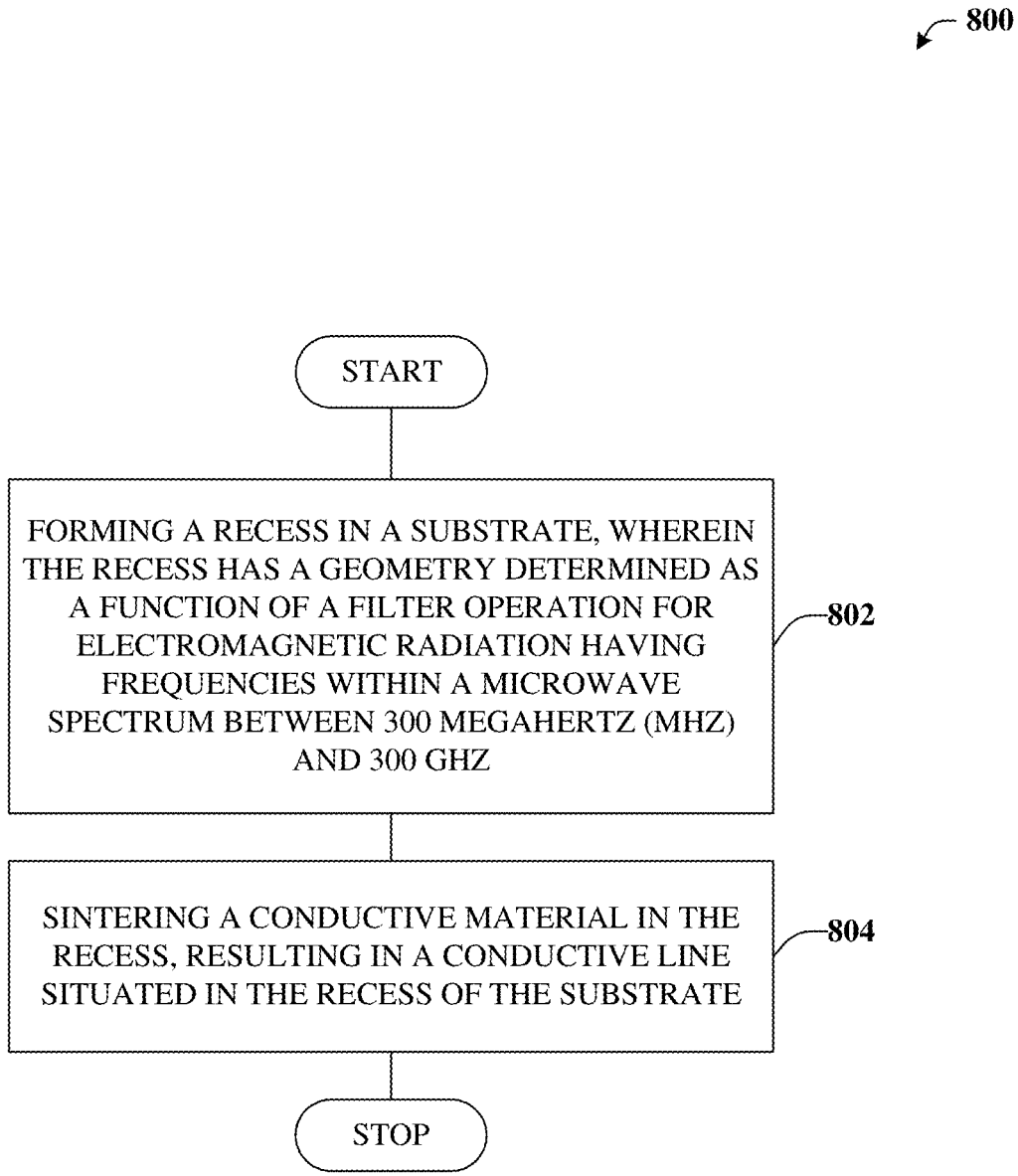
FIG. 8 illustrates a flow diagram of a first example, non-limiting method for fabricating a cryogenic microwave filter in accordance with one or more embodiments.

FIG. 8 illustrates a flow diagram 800 of a first example, non-limiting method for fabricating a cryogenic microwave filter in accordance with one or more embodiments. Repetitive description of like elements employed in other embodiments described herein is omitted for sake of brevity. At reference numeral 802, a fabrication device can form a recess in a substrate or in a dielectric. The recess formed can have a geometry determined as a function of a filter operation for a microwave signal. The microwave signal can represent a particular spectrum of electromagnetic radiation having frequencies between 300 megahertz (MHz) and 300 GHz. A representative example of the geometry can be recess pattern 306 of FIG. 3.

At reference numeral 804, the fabrication device can sinter a conductive material in the recess, resulting in a conductive line situated in the recess of the substrate. As noted, this conductive line can operate as a microwave filter based on the geometry and, advantageously, can be DC-capable such that DC measurements can be employed as well as RF measurements. It is further noted that by sintering the conductive material, the resultant sintered conductive line can have reduced Kapitza resistance at the boundary interface(s) between the conductive line and the substrate. This reduced Kapitza resistance can be due in part to an increased surface contact area at the boundary interface(s) resulting from the sintering process.

Figure 9:
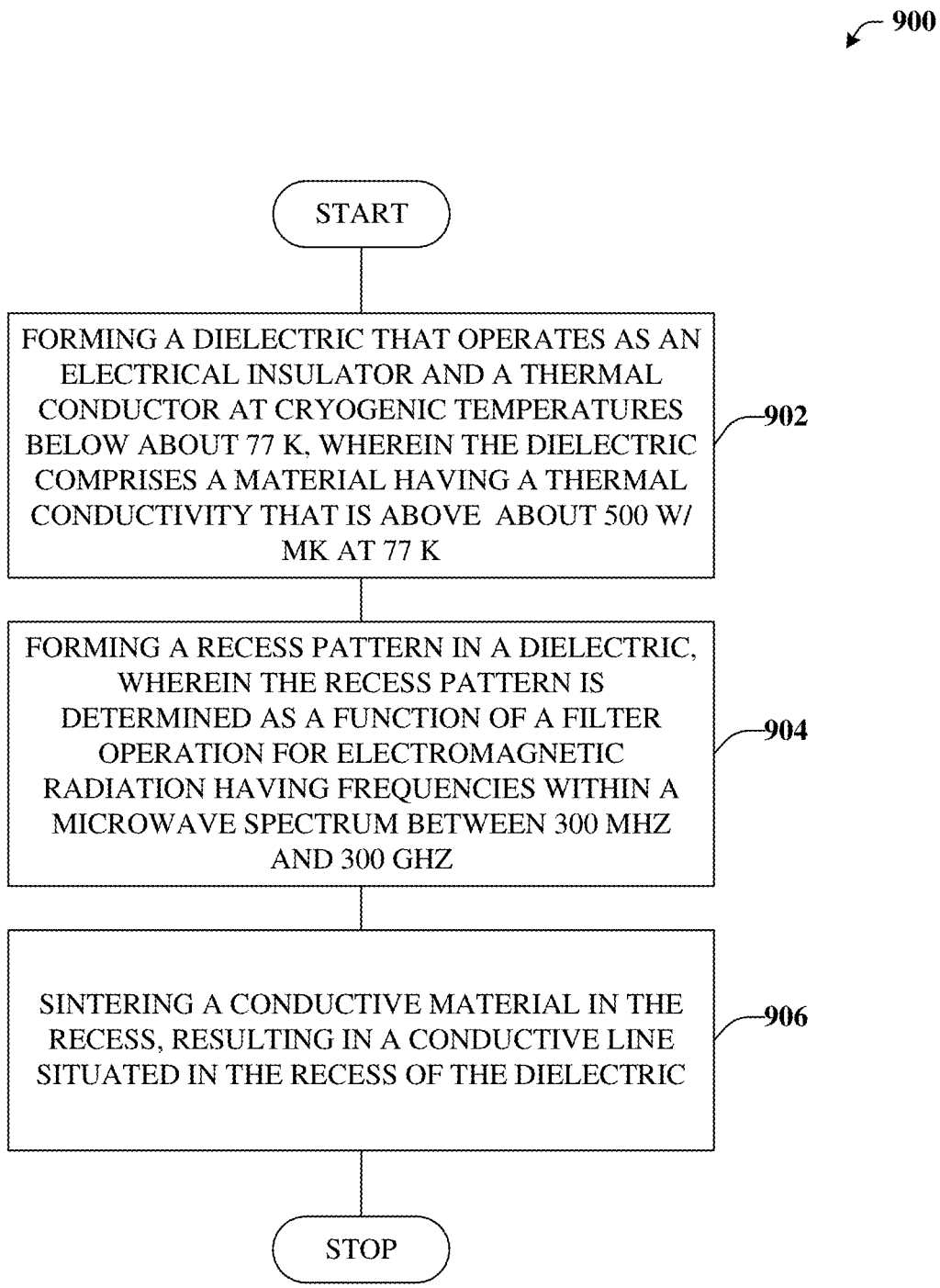
FIG. 9 illustrates a flow diagram of a second example, non-limiting method for fabricating a cryogenic microwave filter in accordance with one or more embodiments.

FIG. 9 illustrates a flow diagram 900 of a second example, non-limiting method for fabricating a cryogenic microwave filter in accordance with one or more embodiments. Repetitive description of like elements employed in other embodiments described herein is omitted for sake of brevity. At reference numeral 902, a fabrication device can form a dielectric that operates as an electrical insulator and a thermal conductor at cryogenic temperatures below about 77 K. In that regard, the dielectric can comprise a material having a thermal conductivity that is above about 500 W/m-K at 77 K. By selecting the material to have a thermal conductivity above the designated threshold (in this case above about 500 W/m-K at 77 K), heat exchange between the conductive line and the dielectric can be improved, which can improve the performance of the cryogenic microwave filter when operating in very low temperature environments. Suitable examples of the material can include a sapphire material, a diamond material, or others.

At reference numeral 904, the fabrication device can form a recess pattern in a dielectric. The recess pattern can be determined as a function of a filter operation for electromagnetic radiation having frequencies within a microwave spectrum between 300 MHz and 300 GHz. A representative example of the geometry can be recess pattern 306 of FIG. 3.

At reference numeral 906, the fabrication device can sinter a conductive material in a recess of the recess pattern, resulting in a conductive line having the recess pattern formed in the recess of the dielectric. As noted, this conductive line can operate as a microwave filter based on the geometry of the recess pattern and, advantageously, can be DC-capable such that DC measurements can be employed as well as RF measurements. It is further noted that by sintering the conductive material, the resultant sintered conductive line can have reduced Kapitza resistance at the boundary interface(s) between the conductive line and the dielectric. This reduced Kapitza resistance can be due in part to an increased surface contact area at the boundary interface(s) resulting from the sintering process.

Figure 10:
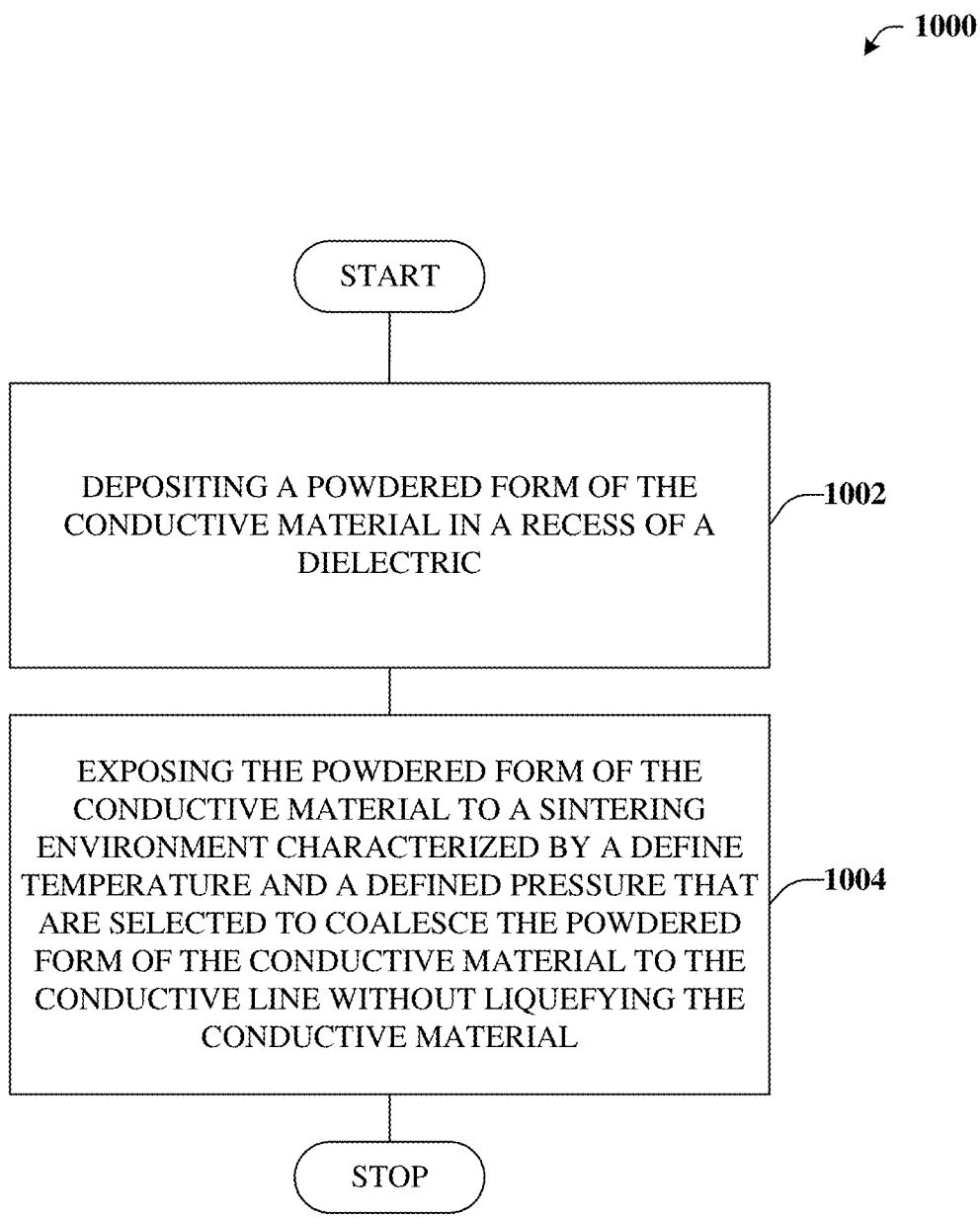
FIG. 10 illustrates a flow diagram of an example, non-limiting method for sintering a conductive material in accordance with one or more embodiments.

FIG. 10 illustrates a flow diagram 1000 of an example, non-limiting method for sintering a conductive material in accordance with one or more embodiments. Repetitive description of like elements employed in other embodiments described herein is omitted for sake of brevity. At reference numeral 1002, fabrication device can deposit a powdered form of the conductive material in the recess of the substrate. The powdered form of the conductive material can be one that is selected to for exceptional thermal conductivity properties, which, as detailed in connection with the material of the substrate can improve the performance of the filter at low temperatures by reducing the temperature drop at the boundary of the conductive line and the substrate. In some embodiments, the powdered form of the conductive material can be one of powdered gold, powdered copper, powdered silver, and powdered aluminum.

At reference numeral 1004, the fabrication device can expose the powdered form of the conductive material to a sintering environment or sintering conditions. The sintering environment or conditions can be characterized by a define temperature and a defined pressure that are selected to coalesce the powdered form of the conductive material to the conductive line without liquefying the conductive material. By employing a sintering technique in connection with the conductive line, higher surface contact area can be achieved between the dielectric and the conductive line, which can operate to reduce Kapitza resistance at low temperatures, and thus improve performance of the cryogenic microwave filter at low temperatures.

Figure 11:
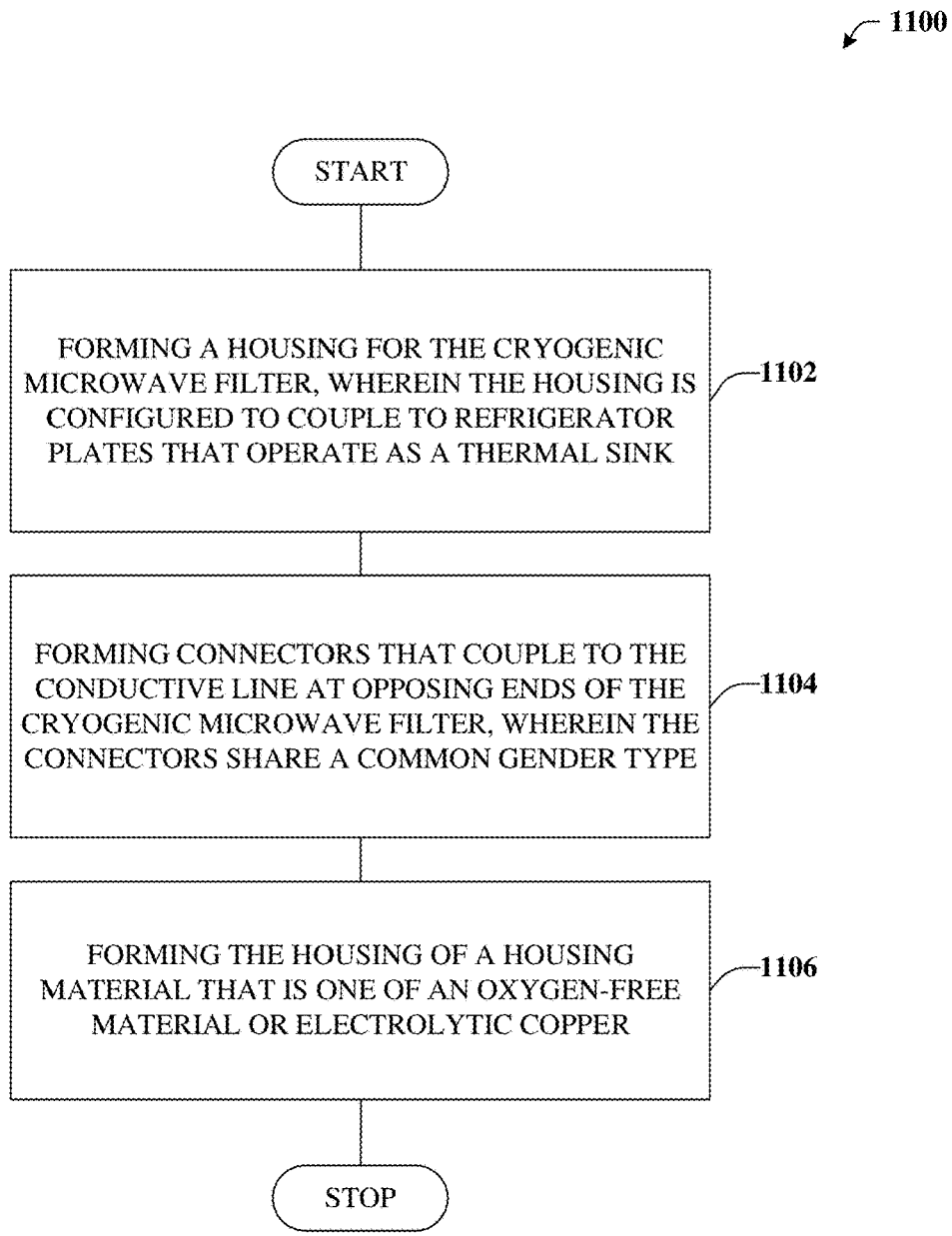
FIG. 11 illustrates a flow diagram of an example, non-limiting method for fabricating a housing for a cryogenic microwave filter in accordance with one or more embodiments.

Turning now to FIG. 11, a flow diagram 1100 if illustrated of an example, non-limiting method for fabricating a housing for a cryogenic microwave filter in accordance with one or more embodiments. Repetitive description of like elements employed in other embodiments described herein is omitted for sake of brevity. At reference numeral 1102, the fabrication device can form or assemble a housing for the cryogenic microwave filter. The housing can be configured to couple to refrigerator plates that operate as a thermal sink.

At reference numeral 1104, the fabrication device can form or assemble connectors. The connectors can couple to the conductive line at opposing ends of the cryogenic microwave filter. In some embodiments, the connectors can share a common gender type. For example, the connectors at both ends of the filter can both be male type connectors or can both be female type connectors. An advantage that can be realized by such an arrangement can be that the number of connections on the qubit control lines can be reduced, which can result in a reduced number of reflection points. As such, cleaner microwave control pulses can be provided and performance of the filter can be improved.

At reference numeral 1106, the fabrication device can form the housing of a housing material that is selected to improve thermalization as well as potentially shield filter elements from noise. In some embodiments, the housing material can be an oxygen-free material. In some embodiments, the housing material can be electrolytic copper.

It is understood that the present invention can be a system, a method, and/or a product form by a specified process. Certain technical application of the invention can be provided by a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create ways for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which can be explicitly illustrated herein.

Figure 12:
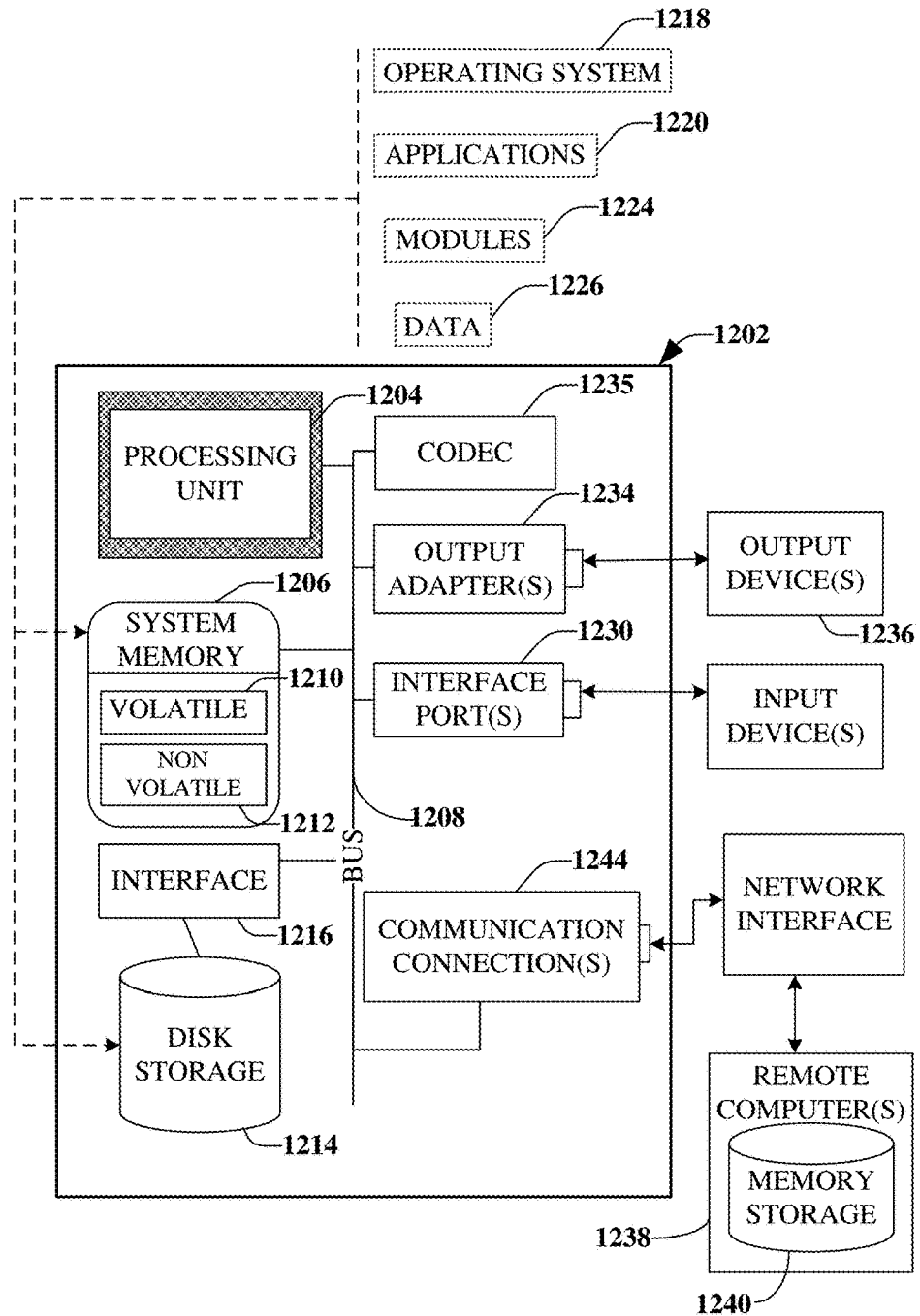
FIG. 12 illustrates a block diagram of an example, non-limiting operating environment in which one or more embodiments described herein can be facilitated.

With reference to FIG. 12, an example environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1206 includes volatile memory 1210 and non-volatile memory 1212, which can employ one or more of the disclosed memory architectures, in various embodiments. The basic input/output system (BIOS), containing the basic routines to transfer information between elements within the computer 1202, such as during start-up, is stored in non-volatile memory 1212. In addition, according to present innovations, codec 1235 can include at least one of an encoder or decoder, wherein the at least one of an encoder or decoder can consist of hardware, software, or a combination of hardware and software. Although, codec 1235 is depicted as a separate component, codec 1235 can be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), Flash memory, 3D Flash memory, or resistive memory such as resistive random access memory (RRAM). Non-volatile memory 1212 can employ one or more of the disclosed memory devices, in at least some embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1202 can also include removable/non-removable, volatile/non-volatile computer storage medium. FIG. 12 illustrates, for example, disk storage 1214. Disk storage 1214 includes, but is not limited to, devices like a magnetic disk drive, solid state disk (SSD), flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1214 to the system bus 1208, a removable or non-removable interface is typically used, such as interface 1216. It is appreciated that storage devices 1214 can store information related to a user. Such information might be stored at or provided to a server or to an application running on a user device. In one embodiment, the user can be notified (e.g., by way of output device(s) 1236) of the types of information that are stored to disk storage 1214 or transmitted to the server or application. The user can be provided the opportunity to opt-in or opt-out of having such information collected or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer system 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port can be used to provide input to computer 1202 and to output information from computer 1202 to an output device 1236. Output adapter 1234 is provided to illustrate that there are some output devices 1236 like monitors, speakers, and printers, among other output devices 1236, which require special adapters. The output adapters 1234 include, by way of illustration and not limitation, video and sound cards that provide a way of connection between the output device 1236 and the system bus 1208. It should be noted that other devices or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1244 refers to the hardware/software employed to connect the network interface 1242 to the bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other embodiments to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration and are intended to be non-limiting. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming, by a fabrication device, a recess in a substrate, wherein the recess has a geometry determined as a function of a filter operation for electromagnetic radiation having frequencies within a microwave spectrum between 300 megahertz (MHz) and 300 gigahertz (GHz);
    sintering, by the fabrication device, a conductive material in the recess, resulting in a conductive line situated in the recess of the substrate; and
    forming, by the fabrication device, a housing for a cryogenic microwave filter, wherein the housing couples to refrigerator plates that operate as a thermal sink.

2. The method of claim 1, wherein the sintering the conductive material comprises:
    depositing, by the fabrication device, a powdered form of the conductive material in the recess.

3. The method of claim 2, further comprising:
    exposing, by the fabrication device, the powdered form of the conductive material to a sintering environment characterized by a defined temperature and a defined pressure that are selected to coalesce the powdered form of the conductive material to the conductive line without liquefying the conductive material.

4. The method of claim 3, wherein the depositing the powdered form of the conductive material comprises depositing in the recess one of a group consisting of powdered gold, powdered copper, powdered silver, and powdered aluminum.

5. The method of claim 4, wherein the dielectric material is selected from a group consisting of a sapphire material and a diamond material.

6. The method of claim 1, further comprising forming, by the fabrication device, the substrate, wherein the substrate comprises a dielectric material that acts as an electrical insulator while maintaining a high thermal conductivity characterized as a thermal conductivity that is above 200 watts per meter-Kelvin W/m-K at a temperature of 77 degrees Kelvin (K).

7. The method of claim 6, wherein the thermal conductivity is above 1000 W/m-K at a temperature of 77 K, above 1000 W/m-K at a temperature of 20 K, above 20 W/m-K at a temperature of 10 K, and above 10 W/m-K at a temperature of 4 K.

8. The method of claim 1, wherein the housing comprises connectors that couple to the conductive line at opposing ends of the cryogenic microwave filter.

9. The method of claim 8, wherein the connectors share a common gender type.

10. The method of claim 1, wherein the housing is formed of a housing material that is one of an oxygen-free material or electrolytic copper.

11. A method, comprising:
    forming, by a fabrication device, a dielectric that operates as an electrical insulator and a thermal conductor at cryogenic temperatures below about 4 degrees Kelvin (K), wherein the dielectric comprises a material having a thermal conductivity that is above about 50 watts per meter-Kelvin (W/m-K) at 4 K;
    forming, by the fabrication device, a recess pattern in the dielectric, wherein the recess pattern a function of a filter operation for electromagnetic radiation having frequencies within a microwave spectrum between 300 megahertz (MHz) and 300 gigahertz (GHz);
    sintering, by the fabrication device, a conductive material in a recess of the recess pattern, resulting in a conductive line having the recess pattern formed in the recess of the dielectric; and comprising assembling, by the fabrication device, a housing for a cryogenic microwave filter, wherein the housing is configured to couple to refrigerator plates that facilitate a transfer of thermal energy away from the housing.

12. A cryogenic microwave filter product formed by a process, comprising:
    forming, by a fabrication device, a dielectric that operates as an electrical insulator and a thermal conductor at cryogenic temperatures below about 77 degrees Kelvin (K), wherein the dielectric comprises a material having a thermal conductivity that is above about 200 watts per meter-Kelvin (W/m-K) at 77 K;
    forming, by the fabrication device, a recess pattern in the dielectric, wherein the recess pattern is configured as a function of a filter operation for electromagnetic radiation having frequencies within a microwave spectrum between 300 megahertz (MHz) and 300 gigahertz (GHz);

sintering, by the fabrication device, a conductive material in a recess, resulting in a sintered conductive line situated in the dielectric according to the recess pattern; and assembling, by the fabrication device, a housing for a cryogenic microwave filter, wherein the housing is configured to couple to refrigerator plates that facilitate a transfer of thermal energy away from the housing.

* * * * *